(12) United States Patent  
Kawahito

(10) Patent No.: US 7,598,896 B2
(45) Date of Patent: Oct. 6, 2009

(54) A/D CONVERTER WITH NOISE CANCEL FUNCTION

(75) Inventor: Shoji Kawahito, Hamamatsu (JP)

(73) Assignee: National University Corporation Shizuoka University, Shizuoka (JP)

( * ) Notice: Subject to any disclaimer, the term of this patent is extended or adjusted under 35 U.S.C. 154(b) by 0 days.

(21) Appl. No.: 12/066,059

(22) PCT Filed: Sep. 7, 2006

(86) PCT No.: PCT/JP2006/317772

§ 371 (c)(1),
(2), (4) Date: May 8, 2008

(87) PCT Pub. No.: WO2007/029786

PCT Pub. Date: Mar. 15, 2007

(65) Prior Publication Data

US 2009/0102695 A1    Apr. 23, 2009

(30) Foreign Application Priority Data

Sep. 7, 2005    (JP) ............................. 2005-258724

(51) Int. Cl.
*H03M 1/34* (2006.01)
(52) U.S. Cl. ........................................ 341/162; 341/155
(58) Field of Classification Search .......... 341/155–165
See application file for complete search history.

(56) References Cited

U.S. PATENT DOCUMENTS 5,212,486 A    5/1993    Nagaraj 6,128,039 A    10/2000    Chen et al.
6,535,157 B1    3/2003    Garrity et al.
7,345,615 B2 *    3/2008    Kawahito .................... 341/162

FOREIGN PATENT DOCUMENTS

JP    2001-053610    2/2001

(Continued)

OTHER PUBLICATIONS

Steven Decker et al., "A 256×256 CMOS Imaging Array with Wide Dynamic Range Pixels and Column- Parallel Digital Output," IEEE J. Solid-State Circuits, vol. 33, No. 12, Dec. 1998 (pp. 2081-2091).

(Continued)

*Primary Examiner*—Lam T Mai
(74) *Attorney, Agent, or Firm*—Squire, Sanders & Dempsey, L.L.P.

(57) ABSTRACT

An A/D converter comprises capacitors C1, C2, C3, C4, and C5 coupled via a plurality of switches to a differential input/differential output amplifier 1. The capacitor C5 determines a gain of the amplifier 1. A reset level is stored in the capacitor C1, and a signal level is stored in the capacitor C2. One terminal of the capacitor C1 and one terminal of the capacitor C2 are coupled to the respective differential inputs, and the other terminals of the capacitors C1, C2 are coupled to each other, whereby the amplifier 1 generates a difference signal between the reset level and the signal level. The cyclic A/D conversion of this difference signal is performed by switching the capacitors C1, C2, C3, and C4 coupled via a plurality of switches to the differential-input/differential-output amplifier 1, thereby obtaining an A/D conversion value with reduced random noise.

9 Claims, 13 Drawing Sheets

FOREIGN PATENT DOCUMENTS

| | | |
|---|---|---|
| JP | 2003-158432 | 5/2003 |
| JP | 2005-136540 A | 5/2005 |
| JP | 2006-025189 | 1/2006 |

OTHER PUBLICATIONS

Nobuhiro Kawai and Shoji Kawahito, "Noise Analysis of High-Gain, Low-Noise Column Readout Circuits for CMOS Image Sensors," IEEE Trans. Electron Devices, vol. 51, No. 2, Feb. 2004 (pp. 185-194).

Mitsuhito Mase, Shoji Kawahito, Masaaki Sasaki and Yasuo Wakamori, "A 19.5b Dynamic Range CMOS Image Sensor with 12b Column-Parallel Cyclic A/D Converters," 2005 IEEE Int'l Solid-State Circuits Conference, Digest of Technical Papers, Feb. 6, 2005 (pp. 350, 351, 603).

International Search Report for PCT/JP2006/317772, Form PCT/ISA/210, completed Nov. 7, 2006 (1 sheet).

Translation of International Preliminary Report on Patentability for PCT/JP2006/31772, Forms PCT/IB/338, PCT/IB/373 and PCT/ISA/237, issued Mar. 11, 2008 (5 sheets).

* cited by examiner

A/D CONVERTER WITH NOISE CANCEL FUNCTION

TECHNICAL FIELD

The present invention relates to an A/D converter having a function to reduce random noise contained in an output signal from a CMOS image sensor.

BACKGROUND ART

A cyclic A/D converter operates at relatively high speed with a relatively small scale circuit and is a well-known approach suitable for high resolution. FIG. 1 shows an example of a conventional circuit of an cyclic A/D converter. This circuit performs amplification of the gain of 2 per one stage of unit circuits. In response to a result of a comparator in each unit circuit, the circuit performs addition or subtraction operation of a reference voltage. Two bit A/D conversion per one clock can be provided in the circuit in which two stages are connected in cascade arrangement and the output of the cascaded stages is connected to its input. The five-times repetition of this A/D conversion provides a 10 bit A/D conversion result.

Since such a cyclic A/D converter has relatively simple circuitry, an array of cyclic A/D converters can be integrated into the column of an image sensor array as shown in Non-Patent Document 1.

Patent Document 1 discloses a circuit which can perform noise cancellation as well as cyclic A/D conversion using one amplifier as shown in FIG. 2.

Non-Patent Document 2 discloses a method for canceling major components of random noise using a high gain amplifier to reduce the random noise and performing the cancellation of noise generated in pixels.

A circuit in Patent Document 2 reduces a fixed pattern noise using a noise canceling circuit including a two amplifying stages. Moreover, this circuit is characterized in that active devices, such as a switch, are not used in conjunction with the capacitor coupled between the input and output of the first amplifying stage.

In Patent Document 3, cyclic A/D conversion of a signal voltage containing noise is performed to generate a digital value and it is stored in the first register, while cyclic A/D conversion of a signal voltage containing noise and a signal from an optical signal is performed to generate a digital value and it is stored in the second register, and then the noise is canceled by the operation of these values.

In the cyclic A/D converter of Patent Document 4, the input terminal of a parallel type A/D converter circuit is selectively coupled to either a signal input terminal or an output terminal of an operational amplifier via a switch. While one ends of capacitors in a capacitor array are coupled together to a common line, other ends of the capacitors are selectively coupled to an input terminal of the A/D converter circuit, a reference voltage terminal and a ground terminal via respective switches. Patent Document 5 discloses a sample/hold circuit using a differential amplifier circuit.

[Patent Document 1] Japanese Patent Application Laid-open No. 2005-136540
[Patent Document 2] U.S. Pat. No. 6,128,039
[Patent Document 3] Japanese Patent Application Laid-open No. 2006-25189
[Patent Document 4] Japanese Patent Application Laid-open No. 2001-53610
[Patent Document 5] Japanese Patent Application Laid-open No. 2003-158432

[Non-Patent Document 1] S. Decker and R. D. Mcgrath, K. Brehmer and C. G. Sodini, "A 256×256 CMOS imaging array with wide dynamic range pixels and column parallel digital output", IEEE J. Solid-State Circuits, vol. 33, no. 12, pp. 2081-2091, December 1998

[Non-Patent Document 2] N. Kawai and S. Kawahito, "Noise analysis of high gain low noise column readout circuits for CMOS image sensors", IEEE Trans. Electron Devices, vol. 51, no. 2, pp. 185-194 (2004)

DISCLOSURE OF THE INVENTION

Problems to be Solved by the Invention

However, since the circuit in Non-Patent Document 1 requires three amplifiers per channel in total together with an amplifier for canceling noise generated in pixels of an image sensor, the circuit needs a large area on a semiconductor die and also consumes large power.

When cyclic A/D converters in Non-Patent Document 1 and Patent Document 1 are arrayed to form a circuit integrated on the column side of an image sensor array, it is hard to use a large capacitor in the integrated circuit. Accordingly, the circuit becomes more vulnerable to random noise, so that the noise level is not reduced even with the high resolution of the cyclic A/D converters. Moreover, the object of the circuit in Patent Document 2 is not to reduce random noise.

The cyclic A/D converter in Patent Document 3 digitally cancels the noise. Moreover, the cyclic A/D converter in Patent Document 4 uses a parallel type A/D converter circuit and an array of capacitors each of which has one end coupled to a common line, and the parallel type A/D converter circuit requires a large area. Furthermore, Patent Document 5 discloses a sample/hold circuit, but does not disclose a cyclic A/D converter.

According to an aspect of the present invention, by incorporating a function to reduce random noise into an A/D converter circuit without increasing its circuit scale, the incorporated A/D converter circuit performs both random noise reduction and A/D conversion. This incorporation is particularly useful as an A/D converter integrated on the column side of a CMOS image sensor. Moreover, according to another aspect of the present invention, a single circuit processes two input signals to perform noise cancellation and A/D conversion thereto in order to reduce the area of the circuit.

Although various A/D converters integrated into the column of a CMOS image sensor have been reported up to now, there has been no A/D converter that can effectively reduce random noise and perform A/D conversion. According to yet another aspect of the present invention, A/D conversion with high resolution can be performed while significantly reducing random noise without complicating its circuitry. It is said that the noise level of a CMOS image sensor is approaching to that of a CCD image sensor. The superiority of a CMOS image sensor is to achieve low noise read-out by effectively utilizing the processing performed by the circuitry on the column side, which is an advantage of CMOS. However, nobody has reported practical solutions for the above yet. According to yet another aspect of the present invention, there is provided a technique capable of improving the noise performance of a CMOS image sensor to a low noise performance level superior to a CCD image sensor.

According to yet another aspect of the present invention, A/D conversion is performed while effectively reducing random noise by means of A/D converters arranged along the column side of a CMOS image sensor.

Means for Solving the Problems

An A/D converter according to the present invention has a function of noise cancellation of a signal including first and second voltage levels alternately arranged. The first voltage level contains a noise component. The second voltage level contains a significant signal component and a noise component, and the significant signal component is superimposed on the noise component. The function of noise cancellation is provided by subtracting the first voltage level from the second voltage level. The A/D converter comprises: a first stage amplifying means (6) for amplifying an input signal; a first capacitor (C1) for storing a voltage level which is generated from the first voltage level at an output of the first stage amplifying means; a second capacitor (C2) for storing a voltage level which is generated from the second voltage level at the output of the first stage amplifying means; a second stage amplifying means (1) for amplifying a difference between a voltage of the first capacitor and a voltage of the second capacitor; a comparator (2, 3) coupled to an output of the second stage amplifying means; a D/A conversion section (5) controlled by a comparison result of the comparator; a switching means for switching connection of the first and second capacitors; and a control section for controlling turning-on and turning-off of the switching means. The switching means changes the connection of the first and second capacitors to perform noise cancellation and cyclic A/D conversion of the difference using the first and second capacitors.

An A/D converter according to the present invention has a function of noise cancellation of a signal including first and second voltage levels alternately arranged, The first voltage level contains a noise component. The second voltage level contains a significant signal component and a noise component, and the significant signal component is superimposed on the noise component. The function of noise cancellation is provided by subtracting the first voltage level from the second voltage level. The A/D converter comprises: amplifying means (1) for amplifying an input signal; a first capacitor (C1) for storing a voltage level, the voltage level being generated at an output of the amplifying means from the first voltage level; a second capacitor (C2) for storing a voltage level, the voltage level being generated at the output of the amplifying means from the second voltage level; a comparator (2, 3) coupled to the output of the amplifying means; a D/A converter (5) controlled by a comparison result of the comparator; switching means for switching connection of the first and second capacitors to between an input of the amplifying means (1) and the D/A conversion section (5); and a control section for controlling turning-on and turning-off of the switching means. The switching means changes the connection of the first and second capacitors to between the input of the amplifying means (1) and the D/A converter (5) to produce a difference between a voltage of the first capacitor and a voltage of the second capacitor at the output of the amplifying means and to perform cyclic A/D conversion of the difference using the first and second capacitors.

An A/D converter according to the present invention may further comprise: a third capacitor (C3) coupled between an input terminal of the A/D converter and an input of the amplifying means; a fourth capacitor (C5) coupled between an output of the amplifying means (1) and the input; and another switching means for controlling connection of the third and fourth capacitors (C3, C5) and the amplifying means (1). A capacitance ratio of the third capacitor and fourth capacitor (C5) defines a gain of the amplifying means.

In an A/D converter according to the present invention, the amplifying means (1) is a MOS amplifier circuit, and in the MOS amplifier circuit, a polarity of an output signal is inverted with respect to a polarity of an input signal. In amplification in the MOS amplifier circuit to perform noise cancellation, the third capacitor (C3) is coupled between the input terminal of the A/D converter and an input terminal of the MOS amplifier circuit, the fourth capacitor (C5) is coupled between the input terminal of the MOS amplifier circuit and an output terminal of the MOS amplifier circuit, and one end of the first capacitor (C1) and one end of the second capacitor (C2) are coupled by turns to the output terminal of the MOS amplifier circuit so as to store the first voltage level and the second voltage level, respectively, then the one ends of the first capacitor and second capacitor are coupled together to provide a series circuit of the first and second capacitors, and one end of the series circuit is coupled to the input terminal of the MOS amplifier circuit and the other end of the series connection is connected to ground, In cyclic A/D conversion of a noise-canceled signal in the MOS amplifier circuit, the third capacitor (C3) is coupled to the input terminal and output terminal of the MOS amplifier circuit, the cyclic A/D conversion comprises first and second phases, the cyclic A/D conversion is performed by repeating the first phase and the second phase, one terminal of the first capacitor (C1) is coupled to the output terminal of the MOS amplifier circuit in the first phase, while the terminal of the first capacitor (C1) is switched to the D/A conversion section, the D/A conversion section provides a reference voltage for D/A conversion in the second phase, and other terminal of the first capacitor (C1) is connected to the earth potential in the first phase, while the other terminal of the first capacitor (C1) is switched to the input terminal of the MOS amplifier circuit in the second phase.

In an A/D converter according to the present invention, the amplifying means (1) is a MOS amplifier circuit with differential input and differential output. In amplification in the MOS amplifier circuit to perform noise cancellation, the third capacitor (C3) is coupled between the input terminal of the A/D converter and a negative input terminal of the MOS amplifier circuit, the fourth capacitor (C5) is coupled between the negative input terminal of the MOS amplifier circuit and a positive output terminal of the MOS amplifier circuit, and the positive input terminal and negative output terminal of the MOS amplifier circuit are short-circuited and connected to a DC potential, and the first capacitor (C1) and the second capacitor (C2) are coupled by turns to the positive output terminal of the MOS amplifier circuit so as to store the first voltage level and second voltage level, respectively, and then, one ends of the first capacitor (C1) and the second capacitor (C2) are coupled to the negative input terminal and positive input terminal of the MOS amplifier circuit, respectively, while the other ends of the first capacitor (C1) and second capacitor (C2) are coupled to each other.

In cyclic A/D conversion of a noise-canceled signal in the MOS amplifier circuit, the third capacitor (C3) is coupled to the negative input terminal and the positive output terminal of the MOS amplifier circuit, the fifth capacitor (C4) is coupled to the negative input terminal and the positive output terminal of the MOS amplifier circuit, the cyclic A/D conversion comprises a first phase and a second phase, and the cyclic A/D conversion is performed by repeating the first and second phases, one terminal of the first capacitor (C1) and one terminal of the second capacitor (C2) are coupled to the positive output terminal and negative output terminal of the MOS amplifier circuit in the first phase, respectively, while the one terminal of the first capacitor (C1) and the one terminal of the second capacitor (C2) are switched to a D/A conversion section, and the D/A conversion section provides a reference voltage for D/A conversion in the second phase, and other terminal of the first capacitor (C1) and other terminal of the second capacitor (C2) are switched to ground in the first phase, while the other terminal of the first capacitor (C1) and the other terminal of the second capacitor (C2) are switched to the negative input terminal and the positive input terminal of the MOS amplifier circuit in the second phase, respectively.

In an A/D converter according to the present invention, in the cyclic A/D conversion by use of the fourth capacitor (C5), the fourth capacitor (C5) is coupled to between the input terminal and the output terminal of the MOS amplifier circuit, thereby reducing a number of switching elements.

An A/D converter according to the present invention comprises: a first input terminal for receiving one of first and second signal sequences and a second input terminal for receiving the other of the first and second signal sequences; a third capacitor (C3) coupled between the first input terminal and a first input of the amplifying means (1); a fourth capacitor (C5) coupled between the first input of the amplifying means (1) and a first output of the amplifying means (1); a fifth capacitor (C4) coupled between the second input terminal and a second input of the amplifying means (1); a sixth capacitor (C6) coupled between the second input of the amplifying means (1) and a second output of the amplifying means (1); two capacitors (C1B, C2B) for storing the first voltage level and the second voltage level, respectively. A capacitance ratio of the fourth capacitor (C5) and the third capacitor defines a gain of the amplifying means, and a capacitance ratio of the third capacitor and the sixth capacitor (C6) defining a gain of the amplifying means. The amplifying means (1) comprises a differential amplifier with two input terminals and two output terminals, and comprises first and second modes which are switchable. In the first mode, the differential amplifier operates as an amplifier circuit with differential input and differential output to perform cyclic A/D conversion, and in the second mode, a common source of the differential amplifier is connected to a constant potential such that the differential amplifier operates as two single-ended amplifiers to perform noise cancellation.

In an A/D converter according to the present invention, the first and second signal sequences are provided from first and second column lines, respectively. The first and second column lines are coupled to first and second pixel rows of an image sensor pixel array, respectively. The image sensor pixel array includes a plurality of pixels arranged in rows and columns.

ADVANTAGES OF THE INVENTION

According to the present invention, by incorporating a function to reduce random noise into an A/D converter circuit, an A/D converter is provided that performs random noise reduction and A/D conversion without increasing the circuit scale.

BRIEF DESCRIPTION OF THE DRAWINGS

The above object and other objects, features, and advantages of the present invention will be understood easily from the following detailed description of the preferred embodiments of the present invention with reference to the accompanying drawings.

DESCRIPTION OF THE REFERENCE SYMBOLS

Figure 1:
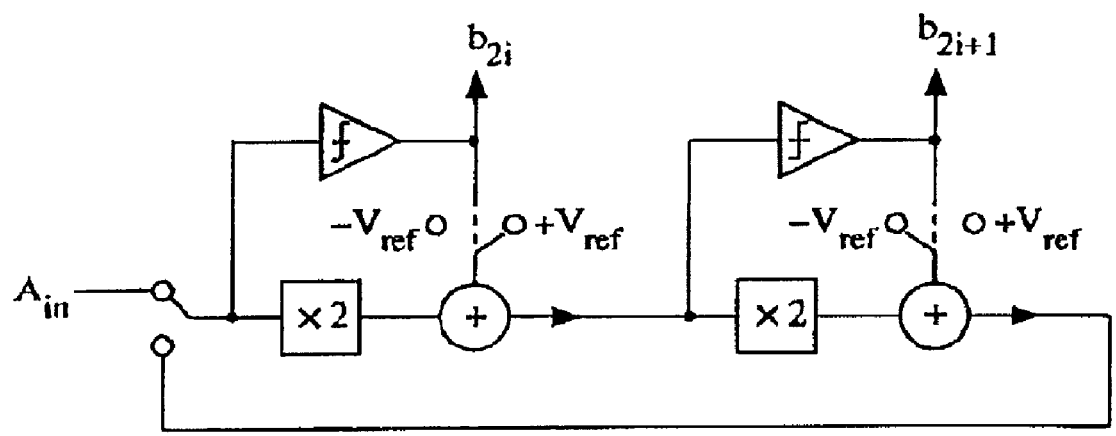
FIG. 1 is a view showing a cyclic A/D converter in the prior art.
Figure 2:
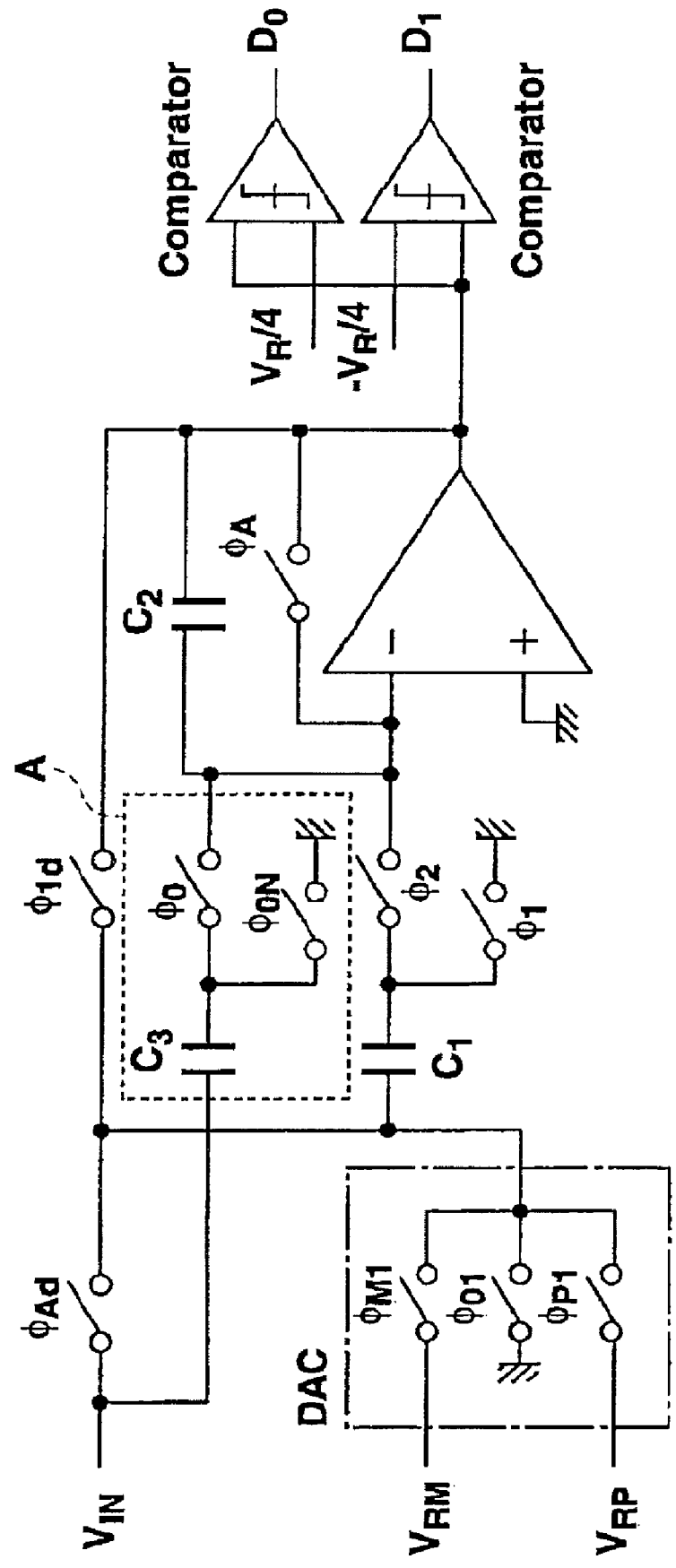
FIG. 2 is a view showing a cyclic A/D converter with a dual-functioning-amplifier having a function of noise cancellation in the prior art.

1 differential input and differential output amplifier
2, 3 comparator
4 decoder
5 digital-to-analog converter (DAC)
6 inverting amplifier
11 vertical shift register
12 image array
13 pixel
14 cyclic analog-to-digital converter with function of noise cancellation
15 data register
16 horizontal shift register
17 redundant-representation to non-redundant representation converter
21 amplifier with differential-operation switching function

BEST MODES FOR CARRYING OUT THE INVENTION

The teaching of the present invention will be readily understood in view of the following detailed description with reference to the accompanying drawings illustrated by way of example. Referring to the accompanying drawings, embodiments of A/D converters according to the present invention will be explained. When possible, parts identical to each other will be referred to with symbols identical to each other.

The A/D converter of the present invention controls the turning-on/off of switches for coupling capacitors. The A/D converter performs the cancellation of noise components (such as reset noise and fixed pattern noise) from a pixel section by using a single amplifier as well as the cancellation of dominant random noise generated in an amplifier, and in addition to these cancellations, performs high-resolution A/D conversion. The embodiments of the present invention will be shown below. Reference symbols containing capital "φ" represent control signals. When the value of a control signal is "1", a switch controlled by the control signal is turned on, while when the value of the control signal is "0", a switch controlled by the control signal is turned off. The control signals are generated synchronously with a control signal for transferring a photo charge from an image array to the outside, and are generated by a control signal generator.

The present invention is suitable for processing of a signal, such as an output signal from a CMOS image sensor, and this output signal includes a first voltage level and a second voltage level sequentially arranged. The first voltage level has a noise component. The second voltage level has a significant signal component and a noise component, and the significant signal component is superimposed on the noise component of the second voltage level.

First Embodiment

Figure 3:
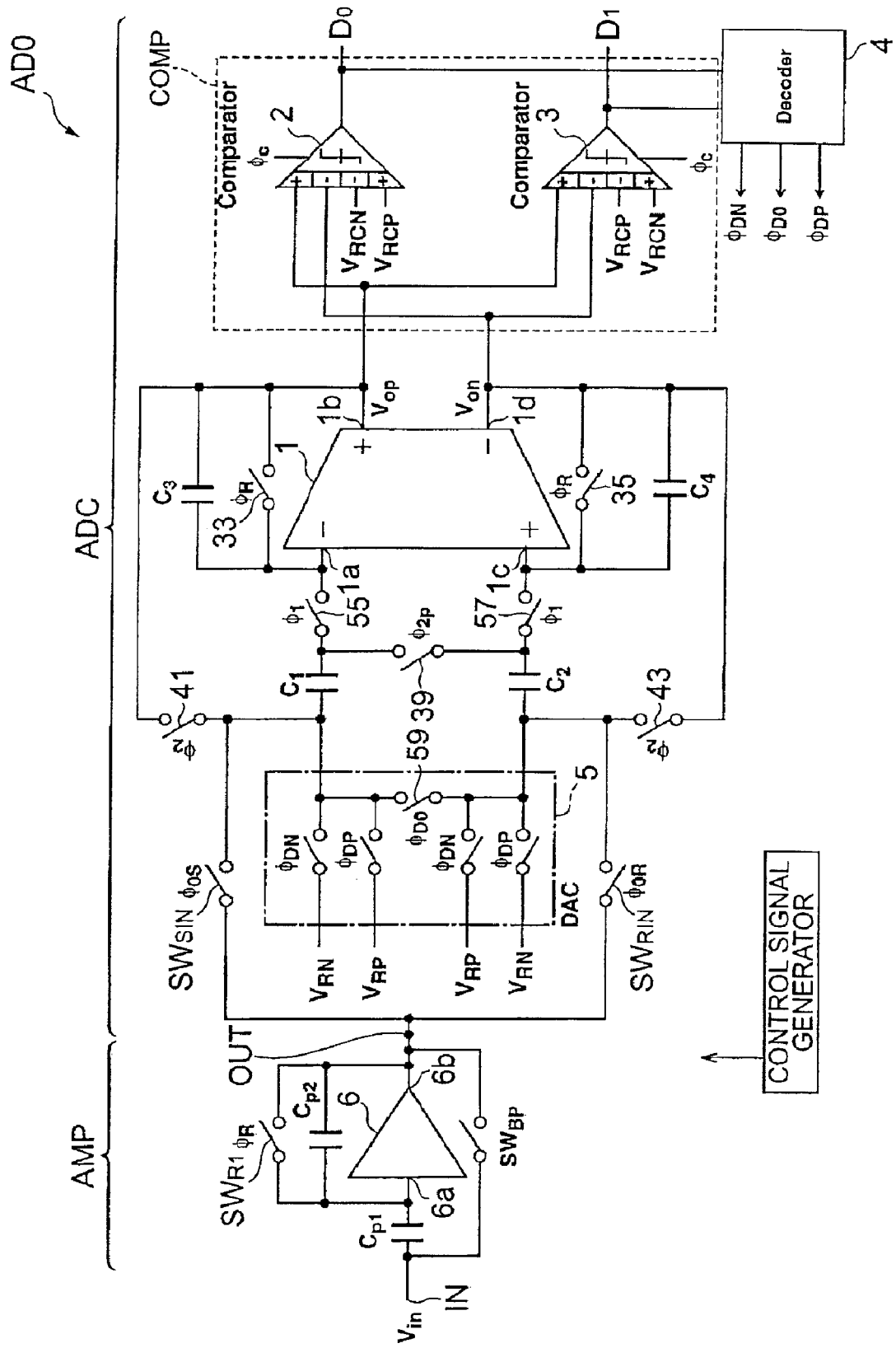
FIG. 3 is a view showing an example of a cyclic A/D converter with a noise reduction function.

A circuit AD0 shown in FIG. 3 comprises an amplification-stage AMP, and an A/D conversion-stage ADC that performs cyclic A/D conversion in response to the output of the amplification-stage AMP. The amplification-stage AMP in this circuit comprises an inverting amplifier 6, and two capacitors Cp1 and Cp2. The capacitor Cp2 is coupled between an input 6a and output 6b of the inverting amplifier 6, and the capacitor Cp1 is coupled between an input IN and the input 6a of the inverting amplifier 6. An input signal Vin is supplied to the input 6a of the inverting amplifier 6 via the capacitor Cp1. The gain G in this amplification-stage AMP is given by Cp1/Cp2. As the inverting amplifier 6, an operational amplifier circuit with an inverting input and a non-inverting output can be used. The inverting amplifier 6 may comprise a MOS amplifier circuit, for example.

An output OUT of the amplification-stage AMP generates a first signal in response to a voltage level indicative of a noise level, and generates a second signal in response to a voltage level containing both noise level and the signal that is generated in response to an optical signal. The A/D conversion-stage ADC samples the first and second signals from the output OUT of the amplification-stage AMP into capacitors C1 and C2, respectively. The sampling into the capacitor C1 is performed via a switch ($\phi_{OS}$) SW$_{SIN}$. The switch ($\phi_{OS}$) is turned on in response to a control signal $\phi_{OS}$, and a switch ($\phi$1) is turned on in response to a control signal $\phi$1. Similarly, the sampling into the capacitor C2 is performed via a switch ($\phi_{OR}$) SW$_{RIN}$. The switch ($\phi_{OR}$) is turned on in response to a control signal $\phi_{OR}$, and switches ($\phi_1$) 55, 57 are turned on in response to the control signal $\phi$1. During this period, switches ($\phi$2) 41, 43 are turned off in response to a control signal $\phi$2. The subsequent operation, e.g., the operation of cyclic A/D conversion, will be described in Embodiment 2.

In addition, the charges in capacitors Cp2, C3, and C4 are initialized in response to the control signal $\phi_R$, and this initialization is performed using switches SW$_{R1}$, 33, and 35 coupled to both ends of the capacitors Cp2, C3, and C4, respectively. A switch SW$_{BP}$ is coupled between the input IN and an output of the amplification-stage AMP in order to bypass the amplification stage, if desired.

Second Embodiment

Figure 4:
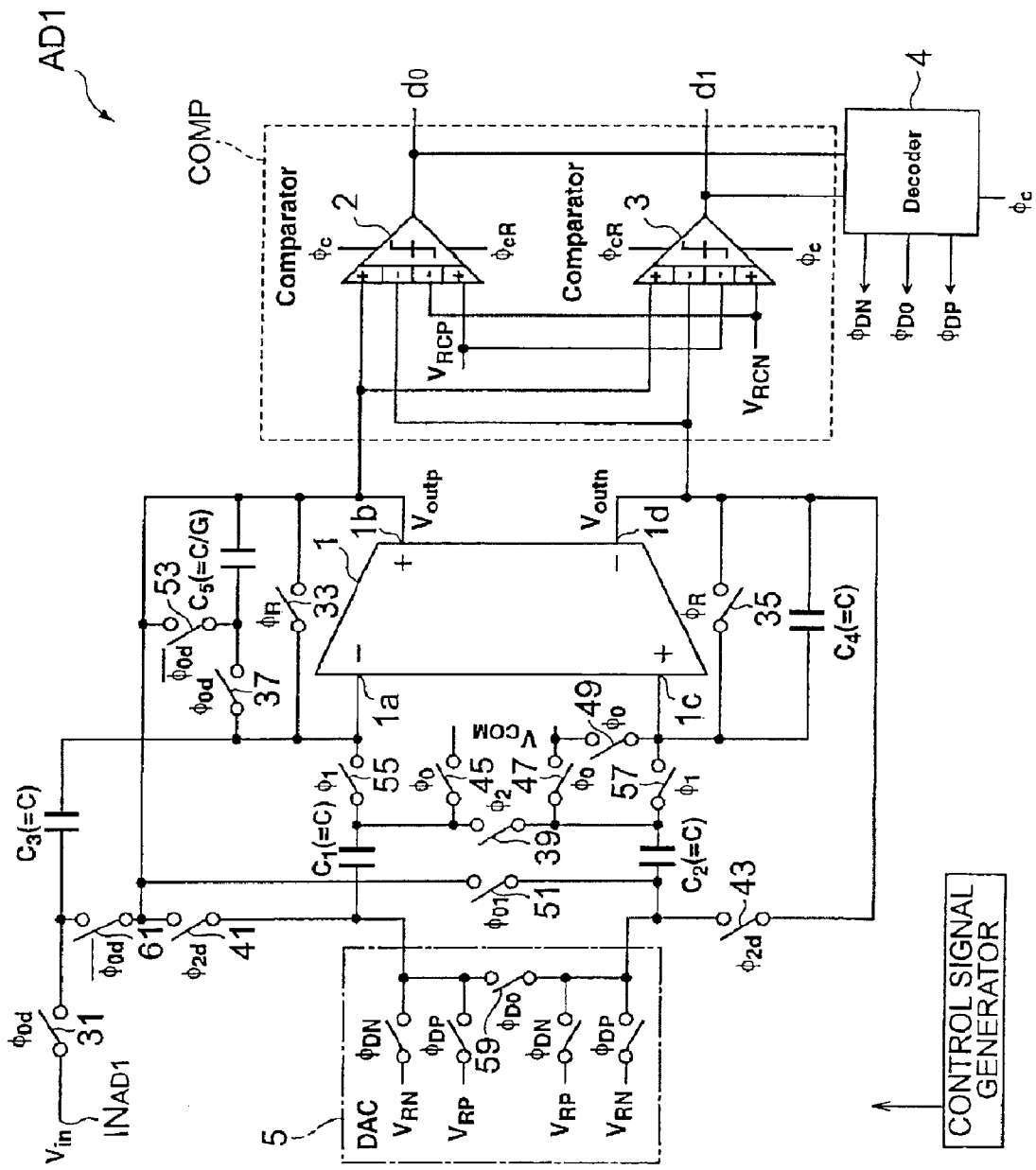
FIG. 4 is a view showing another example of the cyclic A/D converter with a noise reduction function.
Figure 6:
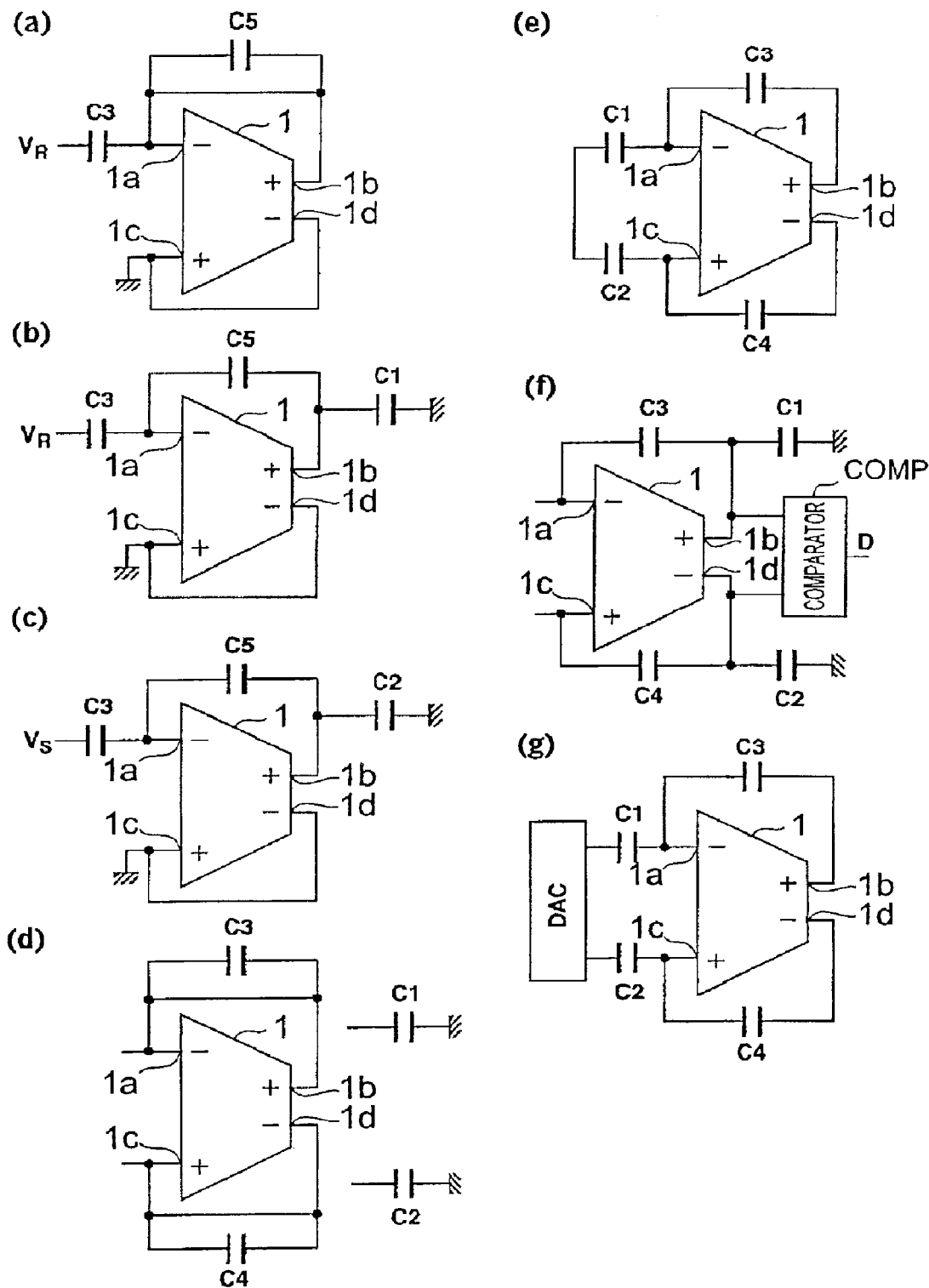
FIG. 6 is a view showing major steps in the operation of the cyclic A/D converter with a noise reduction function.
Figure 7:
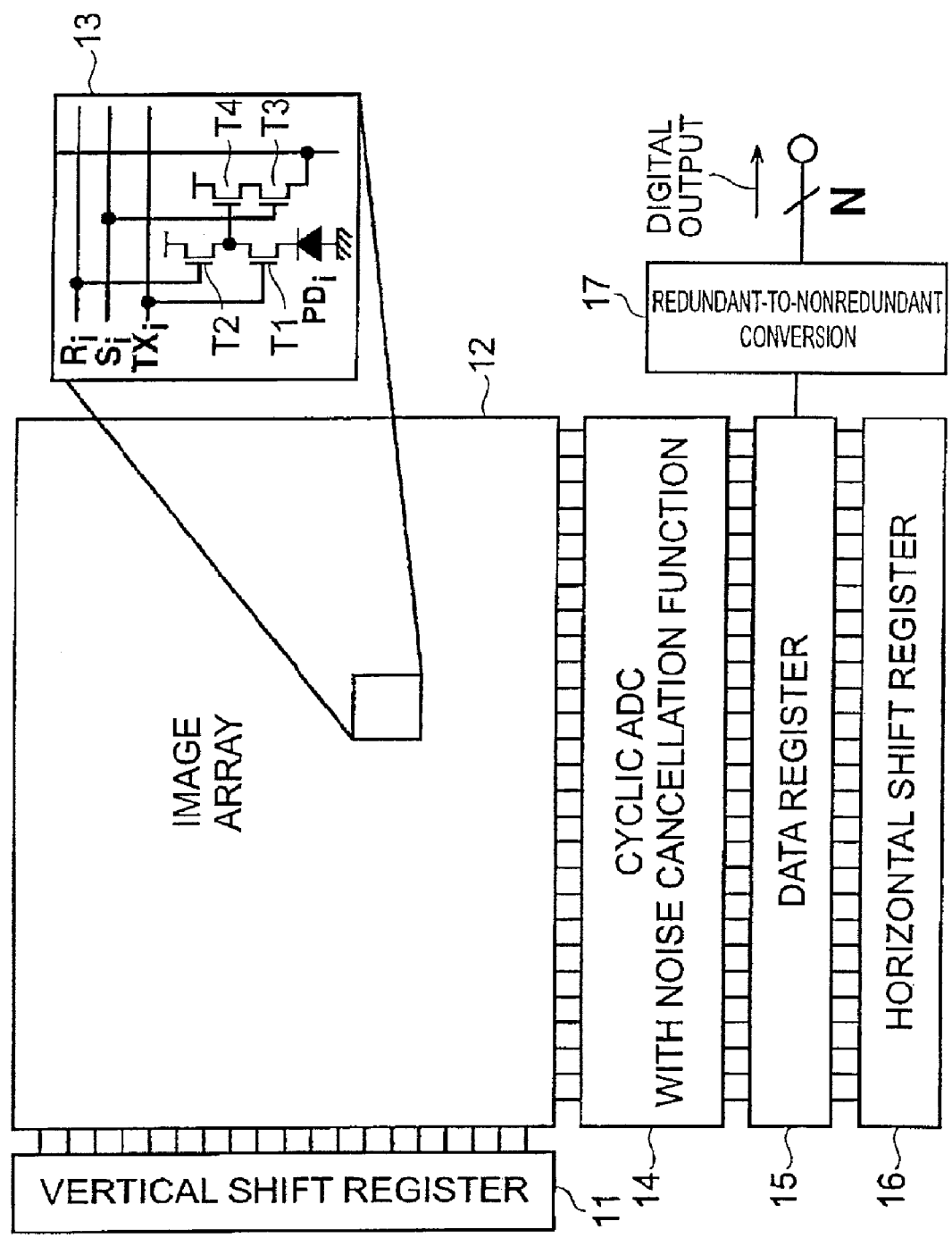
FIG. 7 is a view showing an example of an image sensor in which an array of the circuits of FIG. 4 is provided in a column of an image sensor array so as to integrate the image sensor array with the array of A/D converters.

With reference to a circuit AD1, a second embodiment for performing amplification operation and cyclic A/D conversion is explained below. FIG. 4 shows an example of a circuit of a cyclic A/D converter with a noise reducing function according to the second embodiment. An amplifier 1 may be provided as an amplifying means. A comparator circuit (comparators 2, 3) COMP for A/D conversion is coupled to the output of the amplifier 1, and a decoder 4 is coupled to the comparator circuit (comparators 2, 3) COMP. Further, a D/A conversion circuit (DAC) 5 for cyclic D/A conversion is coupled to the input of the amplifier 1 via capacitors C1, C2. As shown in FIG. 7, an array of this circuit AD1 is integrated into the column of an image sensor array and the arrayed circuits are operated in parallel. FIG. 6 shows the principle of the read operation of a signal from a pixel section in the image sensor array, in addition to the noise reducing operation and the subsequent cyclic A/D conversion operation performed by means of the circuit of FIG. 4. In the explanation with reference to FIG. 6, V$_{COM}$ in FIG. 4 is referred to as "GND". The amplifier 1 may comprise an operational amplifier circuit, and this operational amplifier circuit has an inverting input 1a, a non-inverting input 1b, an inverting output 1c, and a non-inverting output 1d.

First, the circuit AD1 is switched into a circuit connection shown in Step (a) of FIG. 6, and a reset level VR from a pixel of an i-th line is provided to an input IN$_{AD1}$ of the circuit AD1, and the received signal is sampled into the capacitor C3. While charges in the capacitors C5, C4 are reset, Vcom is provided to the input 1c of the amplifier 1 via a switch 49. Switches 31, 37, 33, 35, 39, 41, 43, 45, 47 and 49 are turned on using control signals $\phi_{0d}$, $\phi_R$, $\phi_2$, $\phi_{2d}$, and $\phi_0$.

After completion of the sampling, the reset level VR is still applied to the input IN$_{AD1}$ of the circuit AD1, the circuit AD1 is switched into a circuit connection shown in Step (b) of FIG. 6, thereby storing an output value of the amplifier 1 into the capacitor C1 (the switch is turned off by the control signal $\phi_{2d}$). This operation is critically important. Let the output voltage of the amplifier 1 be Vout1, and ideally, Vout1=0 is satisfied. The capacitor C5 is coupled between the input 1a and the output 1b of the amplifier 1. While one end of the capacitor C1 is coupled to the output 1b of the amplifier 1 via the switch 41, the other end of the capacitor C1 is connected to Vcom via the switch 45. Vcom is supplied to the input 1c of the amplifier 1 via the switch 49. The switches 33, 35 are opened in response to a change of the control signal $\phi_R$. The switch 39 is opened in response to a change of the control signal $\phi_2$.

Next, the circuit AD1 is switched into a circuit connection shown in Step (c) of FIG. 6, and a signal level VS from a pixel section is applied to the input IN$_{AD1}$ of the circuit AD1. The signal level VS is applied to the input 1a of the amplifier 1 via the capacitor C3. In response to this application, the amplifier 1 changes its output voltage to Vout2. This output voltage Vout2 is stored in the capacitor C2 (a switch 51 is turned off by the control signal $\phi$01). While the switches 41, 43 are opened in accordance with the control signal $\phi_{2d}$, the switch 51 is closed in response to the control signal $\phi_{01}$, so that one end of the capacitor C2 is coupled to the output 1b of the amplifier 1. Vcom is connected to the other end of the capacitor C2 via the switch 47. Vcom is supplied to the input 1c of the amplifier 1 via the switch 49.

The ideal value of a voltage in the capacitor C2 is expressed as Equation 1.

[Equation 1]

$$V_{OUT2} = -\frac{C_3}{C_5}(V_S - V_R) \tag{1}$$

Namely, the common components (i.e., noise component from the pixel section) in the signal level VS and reset level VR are subtracted and eliminated, and the resultant difference is amplified by a ratio of the capacitor C3 to the capacitor C5

(let the capacitance ratio of the capacitors C3 and C5 be C3/C5=G, then the symbol G represents the gain). Thus, ideally, the voltage signal stored in the capacitor C1 is not necessary, but what is important is that noise is also generated by the amplifier and the like and that the noise is superimposed on the output voltages Vout 1 and Vout 2. The noise encompasses a component Vnc commonly contained in the output voltages Vout1 and Vout2, and independent components (Vn1, Vn2) that are different from each other. The noise components Vn1, Vn2 vary with time.

That is, actual outputs taking the noise components into account is expressed as Equation 2 and Equation 3.

[Equation 2]

$$V_{OUT1} = V_{nc} + V_{n1} \quad (2)$$

[Equation 3]

$$V_{OUT2} = \frac{C_3}{C_5}(V_S - V_R) + V_{nc} + V_{n2} \quad (3)$$

Accordingly, the difference between the output voltage Vout2 and the output voltage Vout1 can be obtained by the operation that is described below with reference to Step (e) of FIG. 6. The difference is expressed as Equation 4.

[Equation 4]

$$V_{OUT2} - V_{OUT1} = \frac{C_3}{C_5}(V_S - V_R) + V_{n2} - V_{n1} \quad (4)$$

Although whether or not the above processing can reduce the noise depends on the magnitude of the respective noises, noises are calculated by use of a high gain amplifier in which the ratio of the capacitance C3 and the capacitance C5 is made large. The calculation actually reveals that the noise component Vnc is dominant. Equation (4) does not include the noise component Vnc.

Figure 5:
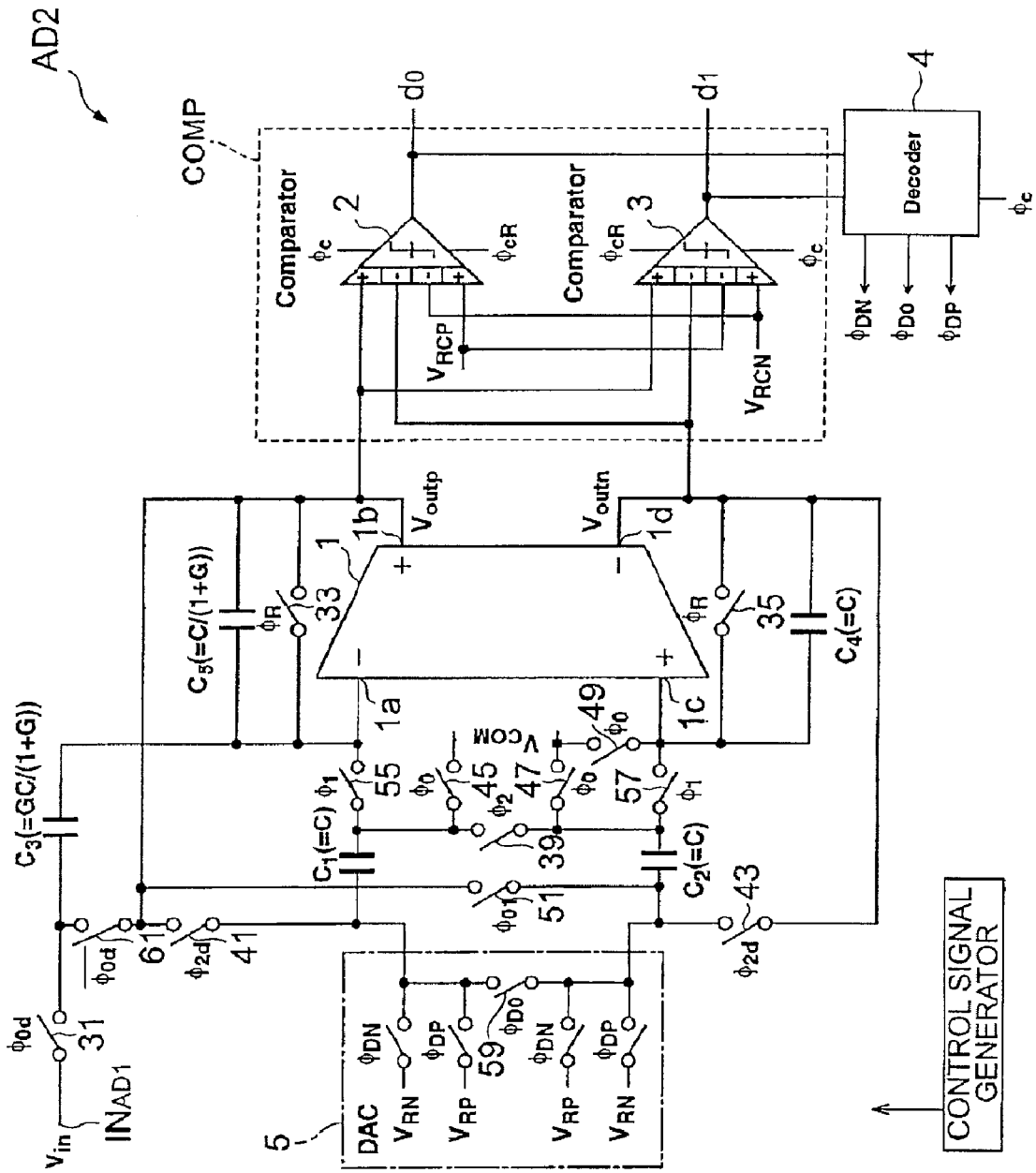
FIG. 5 is a view showing a modified example of an A/D converter obtained by partially modifying the cyclic A/D converter shown in FIG. 4.

A circuit AD2 shown in FIG. 5 does not include the switches 37 and 53, which are included in the circuit AD1 and coupled to one end of the capacitor C5, and thus the circuit AD2 is simpler as compared with the circuit AD1. In the amplification, the capacitors C5, C3 are coupled so as to provide the gain G=C5/C3. In the cyclic A/D conversion, the capacitor C3 and the capacitor C5 are coupled in parallel. The capacitances of the capacitor C3 and capacitor C5 are set so that the combined capacitance of these capacitors C3, C5 is equal to C1. Let the gain in the amplification be G, then the capacitances C3 and C5 are expressed as C3=G×C1/(1+G) and C5=C1(1+G), respectively. When the capacitances of the capacitors C1, C3 and C5 satisfy a certain relation, some of the switches may be omitted.

The operation of cyclic A/D conversion in the circuit AD1 shown in FIG. 4 is described below. The circuit AD1 is switched into a circuit connection, shown in Step (d) of FIG. 6, for preparation of the cyclic A/D conversion. Here, while the capacitor C3 is coupled between the inverting input 1a and the non-inverting output 1b so as to work as a feedback capacitance of the amplifier 1, the capacitor C4 is coupled between the inverting input 1c and the non-inverting output 1d so as to work as a feedback capacitance of the amplifier 1, whereby the charges in the capacitors C3, C4 are initialized by short-circuiting the inputs 1a, 1c and the outputs 1b, 1d of the amplifier 1, respectively. The voltage Vout1 is stored in the capacitor C1 and the voltage Vout2 is stored in the capacitor C2. In this circuit connection, the initialization of charges in the capacitors C3, C4 is performed by the switches 33, 35 that respond to the control signal $\phi_R$. The switches 55, 57, and 61 are turned on in response to the control signals ($\phi_1$, $\phi_{0d}$. While the one ends of the capacitors C1, C2 are coupled to the inverting input 1a and the non-inverting input 1c of the amplifier 1 via the switches 55, 57, respectively, other ends of the capacitors C1, C2 are made floating. The capacitor C1 holds the voltage Vout1 and the capacitor C2 holds the voltage Vout2.

The operation for obtaining a difference between the output voltage Vout2 and the output voltage Vout1 is described with reference to Step (e) of FIG. 6. By coupling other ends of the capacitors C1, C2 to each other, a difference between the charges stored in these capacitors C1, C2 is transferred to the capacitors C3 and C4. If a relation among the capacitance values, C1=C2=C3=C4, is satisfied, the charges are transferred equally. As shown in Equation (4), a difference voltage $V_{DIFF} = V_{OUT2} - V_{OUT1}$ corresponding to VS-VR+Vn2-Vn1 is produced at the output of the differential amplifier. The one ends (ground side) of the capacitors C1, C2 are coupled to the inverting input 1a and the non-inverting input 1c of the amplifier 1 via the switches 55, 57, respectively. The other ends of the capacitors C1, C2 are coupled to each other via a switch 59.

The subsequent operation is to perform the cyclic A/D conversion of the voltage $V_{DIFF}$ generated at the output of this amplifier 1. First, the switches 41, 43 and 39 are turned on in response to the control signals $\phi_{2d}$, $\phi_2$, and the switches 55, 57 and 59 are turned off in response to the control signals $\phi_1$ and $\phi_{D0}$, so that the circuit AD1 is switched into a circuit connection shown in Step (f) of FIG. 6. In this step, the differential output signal of the amplifier 1 is stored in the capacitors C1, C2. Along with this, the voltage level from the output of the amplifier 1 is determined by the comparator circuit (comparators 2, 3) COMP. An output value (d0, d1) of the comparators 2, 3 is coded by the decoder 4.

The circuit AD1 is switched into a circuit connection shown in Step (g) of FIG. 6, and then DAC (digital to analog converter) 5 supplies a voltage value corresponding to the determination result of the comparators 2, 3 to the other ends of the capacitors C1, C2, thereby performing the operation of the following Equation.

[Equation 5]

$$\Delta V_{OUT}(i+1) = 2\Delta V_{OUT}(i) - D(i) \times V_{REF} \quad (5)$$

Here, ΔVout(i) represents the i-th output difference voltage in the cyclic A/D conversion operation, D(i) represents a digital code of the output of the comparator, and a voltage signal, VREF=VRP-VRN, is a reference voltage for DAC 5. In Step (g), in response to the clock φ1, the switches 55, 57 are turned on to couple the one ends of the capacitors C1, C2 to the inverting input 1a and the non-inverting input 1c of the amplifier 1, respectively, while the switches 41, 43 are turned off in response to the clock φ2d to disconnect the feedback path such that the other ends of the capacitors C1, C2 can receive a signal from the DAC 5. By repeating Step (f) and Step (g) of FIG. 6 as required, an A/D conversion result with a required resolution is provided.

In this way, by use of the single amplifier and by controlling the turning-on/off of the switches for coupling the capacitors, the circuit AD1 can perform the cancellation of noises (reset noise and fixed pattern noise) generated in a pixel section and the cancellation of a dominant random noise component generated in the amplifier, and further perform high-resolution A/D conversion.

In order to facilitate the understanding of cyclic A/D conversion, the basic operation of the cyclic A/D converter circuit is described below. At the beginning of the cyclic A/D conversion operation, the capacitor C1 is coupled to the output of the amplifier 1, such as a MOS amplifier circuit, to store charges corresponding to the voltage Vout therein. The capacitor C1 and capacitor C3 store charges Q1 and Q3, respectively, where Q1=C1×Vout and Q3=C3×Vout are satisfied. That is, the charge Q3 is initially charged in the capacitor C3. Subsequently, one end of the capacitor C1 is coupled to the inverting input of the amplifier 1, such as a MOS amplifier circuit. Then, the other end of the capacitor C1 is switched to the DAC 5. Assuming that the DAC generates the reference voltage of Vdac, then the terminal voltage of the capacitor C1 changes from Vout to Vdac, so that the charge difference on the capacitor C1 is expressed as ΔQ1=C1× (Vout−Vdac), and this charge change is transferred to the capacitor C3. As a result, the output voltage of the MOS amplifier circuit 1 is changed to the following:

$$V\text{out}(i+1)=(Q3+\times Q1)/C3=((C1+C3)\times V\text{out}(i)-C1\times V\text{dac})/C3$$

If relational expression C1=C3 is satisfied, this equation can be rewritten, and the following equation is derived:

$$V\text{out}(i+1)=2\times V\text{out}(i)-V\text{dac}.$$

Thus, the basic operation of the cyclic A/D conversion (input voltage is amplified twofold and the resultant voltage is subtracted by a reference value of DAC 5) can be provided.

Figure 8:
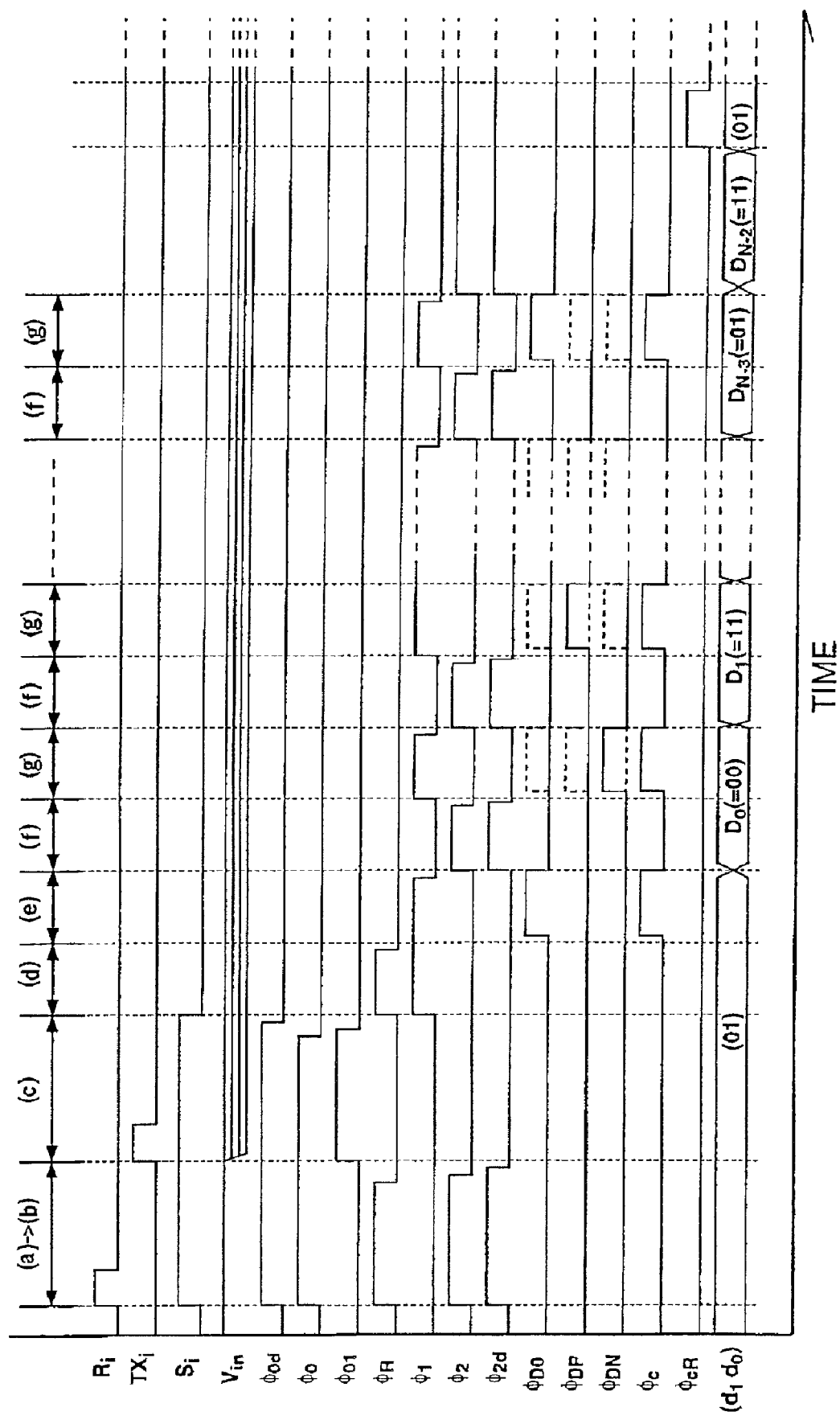
FIG. 8 is a view showing an operation timing for the circuit of FIG. 6.

FIG. 8 shows an operation timing chart of the circuit AD1 of FIG. 4. In FIG. 8, the correspondence between the operation steps shown in FIG. 6 and the value of each control signal is also shown. The timing chart in FIG. 8 shows the operation in which signals from pixels in the i-th row in a pixel array are read parallel to perform noise cancellation and A/D conversion, and shows the sequential read operation of the circuit that is connected to one column. In FIG. 8, the following are also shown: control signals Si (signal to select a pixel), Ri (reset control signal to reset the potential of a floating diffusion region in the pixel section), and TXi (charge transfer control signal to transfer charges from a photodiode section) for the i-th line in the pixel section shown in FIG. 7.

In FIG. 8, (d1 d0) represents the outputs of the two comparators, and (d1 d0) takes the following values.

[Equation 6]

$$(d_1 d_0) = \begin{cases} (1\ 1) & (V_{REF}/4 < V_{out}) \\ (0\ 1) & (-V_{REF}/4 \le V_{out} \le V_{REF}/4) \\ (0\ 0) & (V_{out} \le -V_{REF}/4) \end{cases} \quad (6)$$

When (d1 d0)=(0, 1), (1 1) or (0 0), Di of Equation (5) takes one of value 0, 1, or −1, respectively.

φD0, φDP, and φDN are set to "1" when (d1 d0) is (0 1), (1 1), or (0 0), respectively, and otherwise, these are set to "0". In the operation in Step (e) of FIG. 6, φD0 is also set to "1" and the charges of the capacitors C1, C2 are transferred. The cyclic A/D conversion successively determines bits from the most significant bit by repeating the operations of Step (f) and Step (g) of FIG. 6, and the A/D conversion is repeated (N−2) times in performing N bit A/D conversion. In the operation in the (N−2)th Step (g) of FIG. 6, the least significant bit is determined and outputted. After that, the output (d1 d0) of the comparator is returned to (0 1). An initialization pulse of φcR is applied to the comparator, and in response to the initialization pulse, (d1 d0) will be initialized to (0 1).

In addition, signals VRCN, VRCP in FIG. 4 are set so as to obtain VRCP−VRCN=VREF/4.

An A/D conversion result for each cycle obtained by the cyclic A/D conversion is stored in a data register 15 in the block diagram of FIG. 7, and the stored results are read by horizontal scanning after the A/D conversion. Each A/D conversion result takes three values. That is, the A/D conversion results are expressed in a redundant representation. After being read by a horizontal scanning operation, the A/D conversion results are converted to binary values in non-redundant representation in a redundant representation to non-redundant representation conversion section. A redundant representation to non-redundant representation converter circuit may be arranged in the column, and, however, the arrangement increases circuit scales in the column side.

FIG. 7 shows an example of a CMOS image sensor in which each pixel comprises a photodiode PDi for converting light to electric charge, and several MOS transistors T1 to T4. The transfer of electric charges is controlled by a transistor T1 that responds to a control signal TXi, the initialization of electric charge is controlled by a transistor T2 that responds to a control signal Ri, and the selection of pixels is controlled by a transistor T3 that responds to a control signal Si. A transistor T4 responds to the potential of a node J1 between the transistors T1 and T2. In each pixel, a reset noise is generated in response to the reset operation, and a voltage outputted from each pixel contains a fixed pattern noise inherent to each pixel. Moreover, random noise is generated by devices coupled to the input of the A/D converter. The pixels are arranged in a matrix, and a signal from the pixel is transmitted to one of cyclic analog-to-digital converter circuits 14 with noise cancellation, which are arranged in the column, via a signal line extending in the direction of the column in the drawing.

In FIG. 7, a vertical shift register 11 supplies the control signals Ri, Si, and TXi to the pixels 13 arranged in an image array 12, and a signal corresponding to a photo charge obtained in each pixel is transmitted to the cyclic analog-to-digital converter circuit 14 with a noise canceling function. The array of cyclic analog-to-digital converting circuits 14 with a noise canceling function includes a plurality of basic circuits and can process signals from the pixels in parallel. The processed signals are latched into a data register 15, and are transmitted to an output terminal by a control signal from a horizontal shift register 16. Then, if required, the processed signal is processed in a redundant representation to non-redundant representation converter circuit 17.

Having described the MOS amplifier circuit with differential inputs and differential outputs as an example of the amplifier 1 of the amplifying means, an inverting amplifier circuit with one input and one output may be used for this A/D converter.

Third Embodiment

Figure 9:
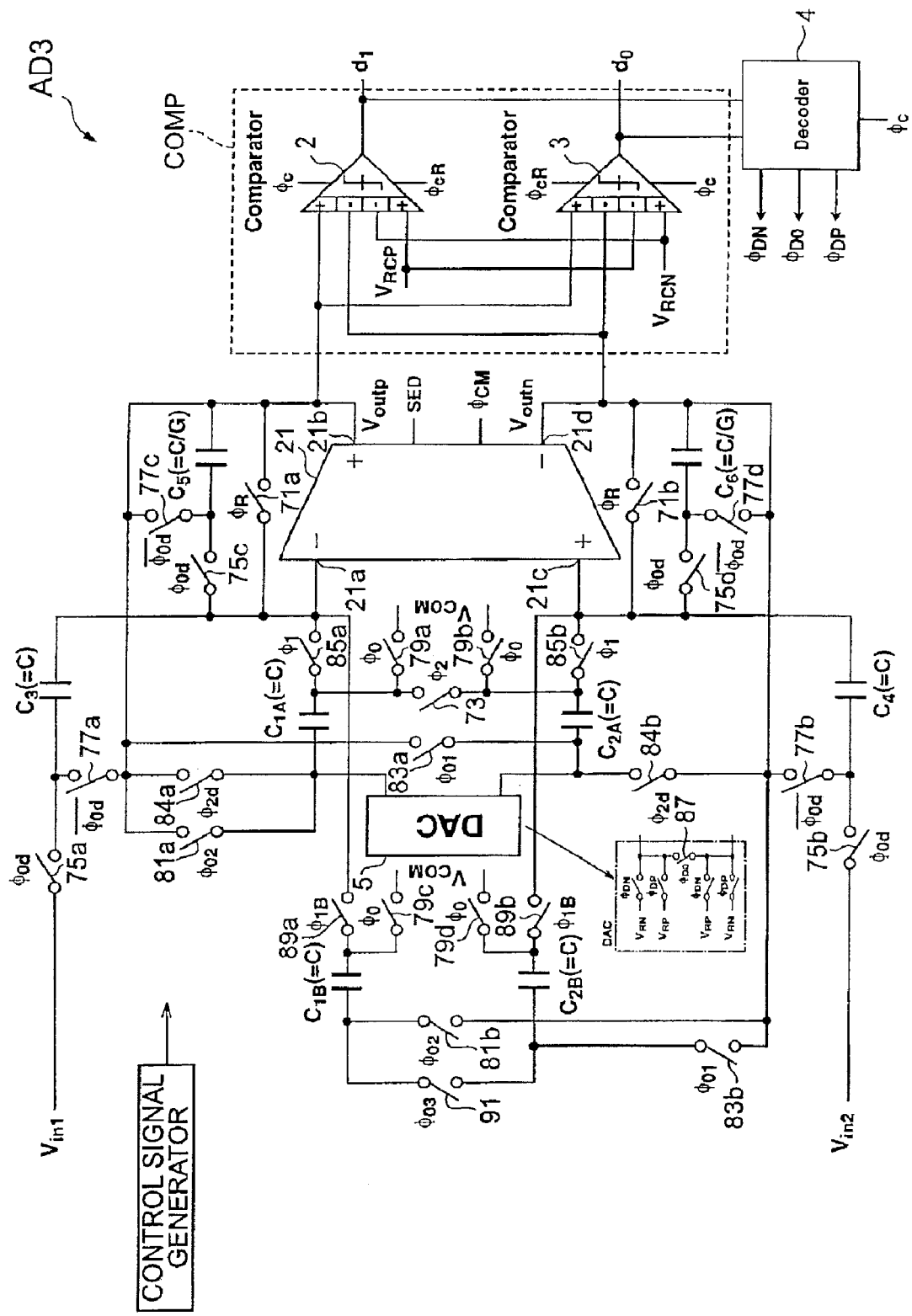
FIG. 9 is a view showing an example of a single A/D converter for performing A/D-conversion of signals from two rows of pixels in an image sensor array.

FIG. 9 shows a third embodiment of an A/D converter that performs, in parallel, noise cancellation of signals from two rows and performs cyclic A/D conversion to these signals by turns. The connection of a circuit AD3 of FIG. 9 is likely to be complicated as compared with the circuit AD1 of FIG. 4. However, since the layout of the circuit AD3 of FIG. 9 may be made across the width of two rows of pixels, the circuit AD3 can be used in place of the circuit AD1 of FIG. 4 even when the pixel size is smaller. In the circuit shown in FIG. 9, an amplifier 21 with a differential-operation switching function is used as the amplifier.

Figure 10:
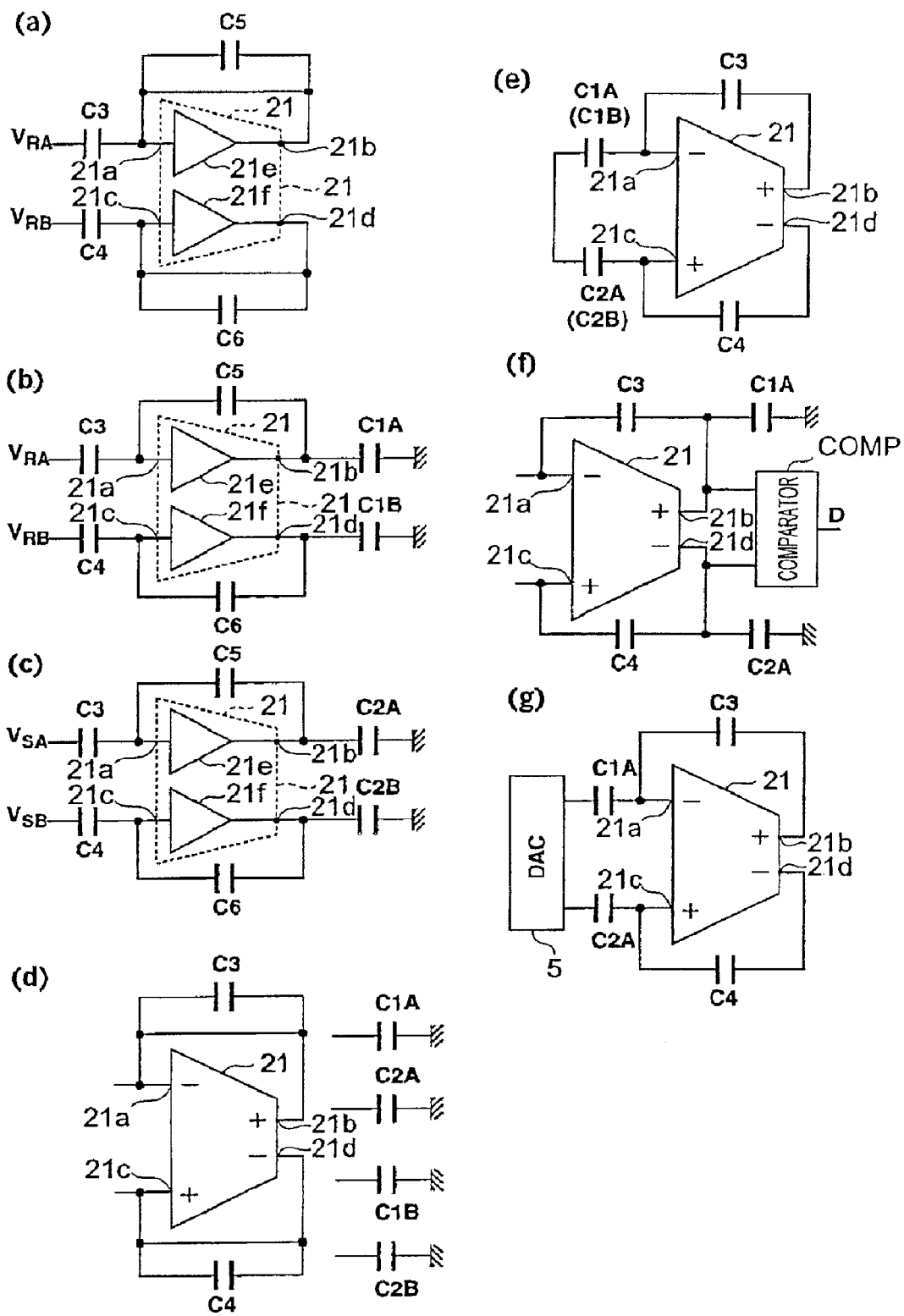
FIG. 10 is a view showing major steps in the operation of the circuit of FIG. 9.
Figure 11:
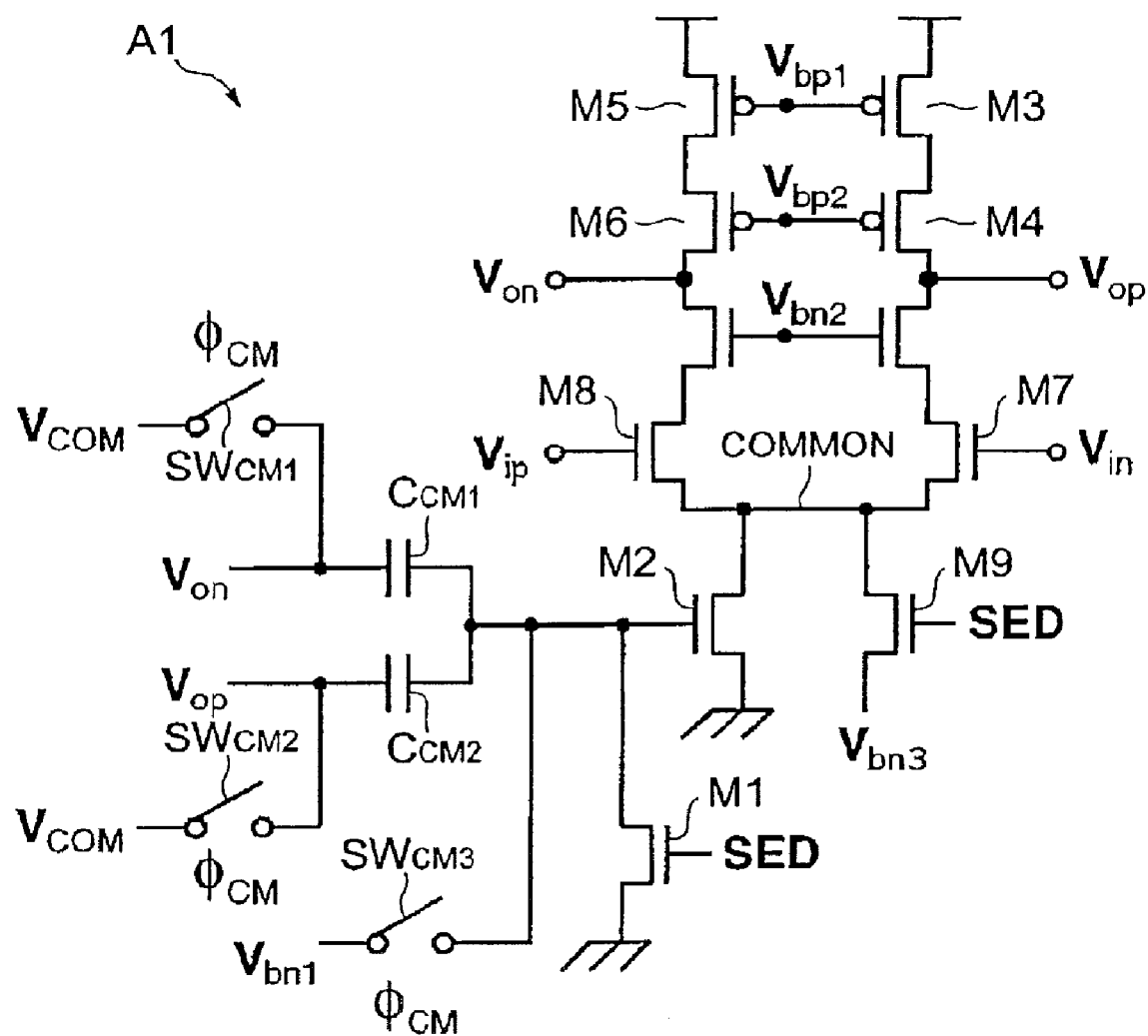
FIG. 11 is a view showing a example of a circuit diagram of an amplifier shown in FIG. 9.

FIG. 10 shows a view explaining the operation of the circuit AD3 of FIG. 9, and FIG. 11 shows a circuit example A1 of the amplifier 21 with a differential-operation switching function as used in FIG. 9. The amplifier circuit A1 shown in FIG. 11 operates as a differential-input/differential-output amplifier including a current source transistor M2, loads M3, M4, M5 and M6, and driving transistors M7, M8 when a control signal SED takes the value of "0", while when the control signal SED takes the value of "1", the amplifier circuit A1 operates as two common-source amplifiers 21e and 21f (one amplifier including the transistors M3, M4, and M7 and the other amplifier including the transistors M5, M6, and M8). In the above two common-source amplifiers, the voltage of a common source node COMMON in the differential circuit is a constant potential Vbn3. The circuit operation is changed using the transistors M1, M9 in response to the control signal SED, and by utilizing this change, the noise cancellation of both signals is concurrently performed using two common-source amplifiers and capacitors. The A/D conversion of the both signals is performed by the cyclic A/D conversion of a differential circuit type. Moreover, in one practical circuit, if GND is used as the fixed potential Vbn3, a wiring area in the circuit can be reduced.

In addition, in the operation mode in which the amplifier circuit with differential input and differential output is used, the output operating point is stabilized using a common-mode signal feedback as shown in FIG. 11. Since the common mode feedback is unnecessary in the operation mode for the two common-source single-ended amplifiers, the gate of an nMOS transistor used for a tail current source for differential input-differential output is set to a low level (for example, zero volts) by the transistor M1, which received the control signal SED, to cut off the current source transistor M2.

In an initial period in the common mode, switches ($\phi$CM) $SW_{CM1}$, $SW_{CM2}$, and $SW_{CM3}$ are turned on by a control signal $\phi$CM to supply a reference operating point signal VCOM and DC bias Vbn1 to common-mode signal feedback capacitors $C_{CM1}$ and $C_{CM2}$. Subsequently, after the direct current point is stabilized by turning off the switches ($\phi$CM) $SW_{CM1}$ to $SW_{CM3}$, the common mode signal is fed back via the capacitors $C_{CM1}$ and $C_{CM2}$.

For the cancellation of noise from the pixel section, first, the control signal SED is set to "1" so that the amplifier circuit A1 is set to work as the two common-source amplifying circuits. In the description of FIG. 10, GND is used as $V_{COM}$ of FIG. 9. Moreover, switches 71a, 71b are turned on using the control signal $\phi$R to couple an inverting input 21a to a non-inverting output 21b of the amplifier 21 and couple a non-inverting input 21c to an inverting output 21d, so that the circuit AD3 is switched to a circuit connection shown in Step (a) of FIG. 10. Since switches 79a, 79b, 79c and 79d are turned on using the control signal $\phi_0$, the voltage $V_{COM}$ is applied to predetermined nodes. Using the control signal $\phi$0d, switches 75a, 75b, 75c and 75d are turned on and switches 77a, 77b, 77c, and 77d are turned off. A reset level VRA of a certain column of pixels in the i-th line and a reset level VRB of the adjacent column, for example, are supplied to the two inputs Vin1, Vin2 of the circuit AD3. These reset levels VRA, VRB are sampled into the capacitors C3, C4, respectively. Since switches 81a, 81b are turned on using the control signal $\phi$02, the one ends of capacitors CA1, CB1 are coupled to the non-inverting output 21b and the inverting output 21d, respectively.

After completion of the sampling, the switches 71a, 71b are turned off in response to a change of the control signal $\phi$R, so that the circuit AD3 is switched to a circuit connection shown in Step (b) of FIG. 10. Output voltages of two amplifiers 21e and 21f in the amplifier 21 are stored into the capacitors C1A and C1B via the switches 81a and 81b (switches are turned off by the control signal $\phi$02), respectively.

Next, since the switches 83a, 83b are turned on using the control signal $\phi$01, the one ends of capacitors CA2 and CB2 are coupled to the non-inverting output 21b and the inverting output 21d, respectively, so that the circuit AD3 is switched to a circuit connection shown in Step (c) of FIG. 10. Signal levels VSA, VSB of two columns of the pixel section are provided to the two inputs Vin1, Vin2 of the circuit AD3, respectively, and then output voltages of the two amplifiers are stored into the capacitors C2A and C2B via the switches 83a, 83b (switches are turned off by the control signal $\phi$01).

Ideally, voltages Voutp and Voutn stored in the capacitors C2A and C2B are expressed as Equations 7 and 8, respectively.

[Equation 7]

$$V_{outp} = -\frac{C_3}{C_5}(V_{SA} - V_{RA}) \qquad (7)$$

[Equation 8]

$$V_{outn} = -\frac{C_4}{C_6}(V_{SB} - V_{RB}) \qquad (8)$$

Namely, the noise in the pixel section is canceled and the amplification in the capacitor ratio is carried out. Further cancellation of random noise components contained in these sampled signals allows for signal read-out with low noise.

The principle the above is the same as that in the description given with reference to FIG. 4. This canceling operation is carried out in the operation of Step (e) of FIG. 10. Prior to the canceling operation, as shown in Step (d) of FIG. 10, the switches 71a, 71b are turned on using the control signal $\phi$R to couple the inputs 21a, 21c to the outputs 21b, 21d of the amplifier 21, respectively, and to initialize the charges at both ends of the cap acitors C3, C4. The one ends of the capacitors C1A, C2A are coupled to the inputs 21a, 21c of the amplifier 21 via the switches 85a, 85b, respectively. A switch 87 is turned on using the control signal $\phi$D0. As in the description with respect to FIG. 4, first, a difference between a voltage stored in the capacitor C1A and a voltage stored in the capacitor C2A is obtained in Step (e) of FIG. 10. With this operation, the amplifier 21 generates a signal the random noise of which has been canceled out. The operations shown in Step (f) and (g) of FIG. 10 are repeated to the output value of the amplifier 21 using the capacitors C3, C4, C1A and C2A tp perform the cyclic A/D conversion. First, the cyclic A/D conversion of an input signal applied to the input Vin1 in FIG. 9 is performed. In Step (f), the one ends of the capacitors C1A, C2A are coupled to the outputs 21b, 21d of the amplifier 21 via the switches 84a, 84b that respond to the control signal $\phi$2d, respectively. The other ends of the capacitors C1A, C2A are coupled to each other via the switch 73. In Step (g), the one ends of the capacitors C1A, C2A are coupled to the outputs of DAC 5, respectively.

Subsequently, returning to the operation of Step (d) of FIG. 10, the cyclic A/D conversion of the input signal applied to the input Vin2 in FIG. 9 is performed. In Step (d) of FIG. 10, the charges of the capacitors C3, C4 are initialized using the switches 71a, 71b in response to the control signal φR. The one ends of the capacitors C1B, C2B are coupled to the inputs 21a, 21c of the amplifier 21 via the switches 89a, 89b, respectively.

Next, a switch 91 is turned on using a control signal φ03. As shown in Step (e) of FIG. 10, the capacitors C1B, C2B are coupled to each other via the switch 87, and the stored charges are transferred to the capacitors C3 and C4 via the switches 89a and 89b, respectively. This operation permits the cancellation of random noise components before the sampling by the amplifier 21, and the amplifier 21 generates a signal that the random noise components have been cancelled. The cyclic A/D conversion of the output value of the amplifier 21 is performed by repeating Step (f) and (g) of FIG. 10.

Figure 12:
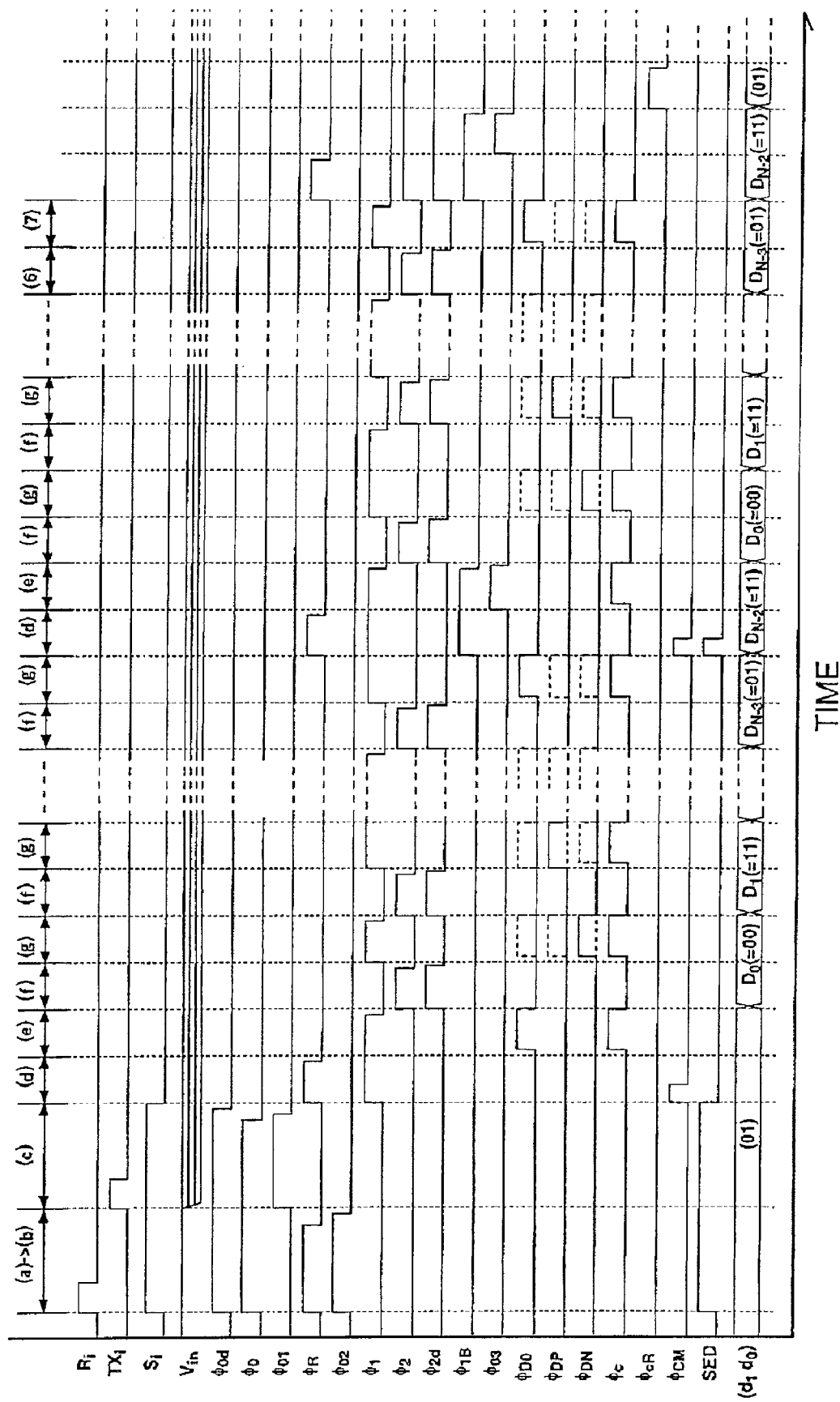
FIG. 12 is a view showing an operation timing for the circuit of FIG. 10.

FIG. 12 shows an example of waveforms of the actual control signals of FIG. 10.

In this circuit AD3, switches in one end of the capacitor C5 may also be omitted as in the case shown in FIG. 5.

Having described the circuits that perform the 1.5 bit conversion in the A/D conversion section, the present invention can be applied to 1 bit conversion and 2 bit conversion as well.

Figure 13:
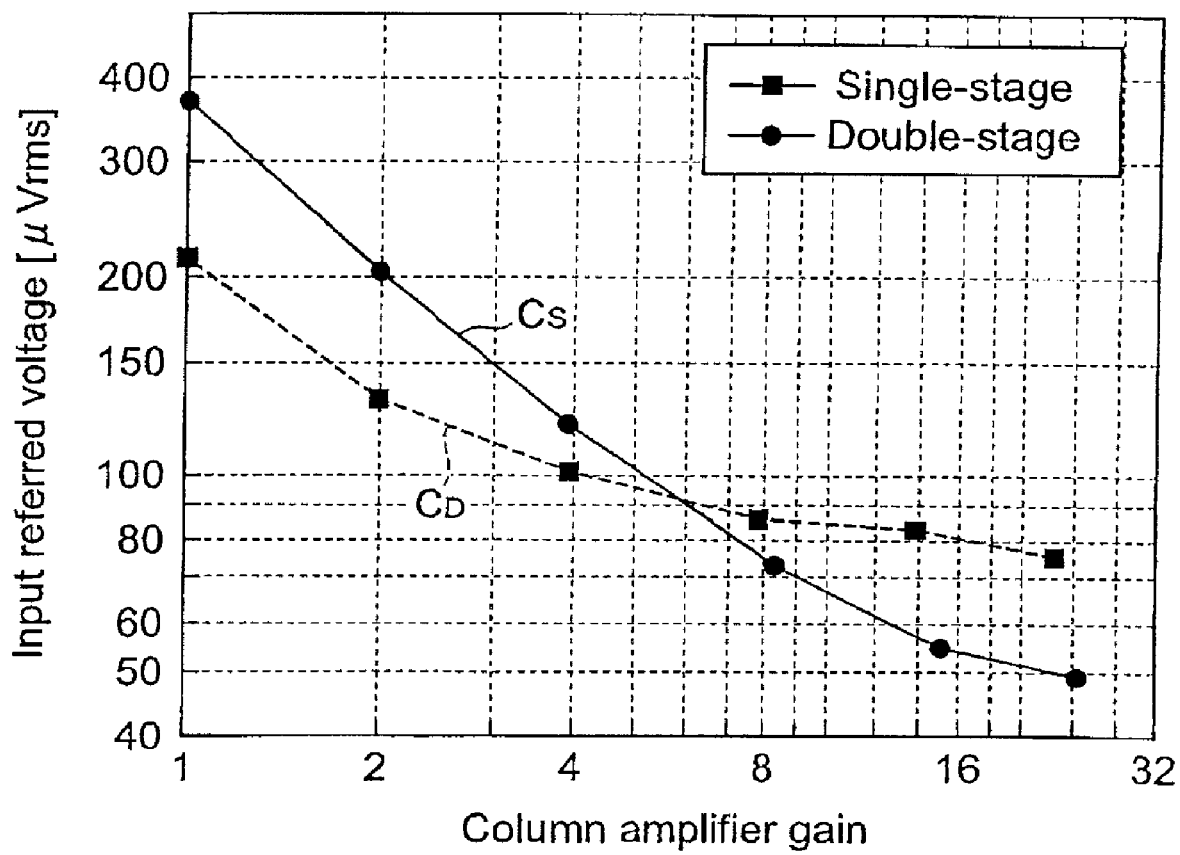
FIG. 13 is a view showing a relation between the noise cancellation performances using a single stage and double stages and the gain of a column amplifier.

Referring to FIG. 13, the graph shows recent measurement data to demonstrate the effect of the present embodiments. The result revealed that the A/D conversion provides extremely high noise reduction. In FIG. 13, the horizontal axis represents the gain of a column amplifier and the vertical axis represents equivalent input noise voltage. Reference symbol "$C_S$" represents the noise cancellation performance in a single stage, and reference symbol "$C_D$" represents the noise cancellation performance in a double stage. With the gain of 20 times or more, the noise cancellation performance in the double stage used in the present embodiment is superior to the noise cancellation performance in the single stage.

Having illustrated and described the principle of the present invention in the preferable embodiments, it should be recognized by those skilled in the art that the present invention may be modified in arrangement and detail without departing from such principle. The present invention is not limited to a specific configuration disclosed in the present embodiments. Therefore, this application claims all the modifications and changes resulting from the claims and the scope and spirit of the invention.

INDUSTRIAL APPLICABILITY

The application of the embodiments according to the present invention to a signal, such as an output signal from a CMOS image sensor, in which a first voltage level containing a noise component and a second voltage level containing a significant signal component and a noise component on which the significant signal component is superimposed, allows for A/D conversion with high resolution and the significant reduction of random noise without using complex circuits.

The invention claimed is:

1. An A/D converter with a function of noise cancellation of a signal including first and second voltage levels alternately arranged, the first voltage level containing a noise component, the second voltage level containing a significant signal component and a noise component, the significant signal component being superimposed on the noise component, the function of noise cancellation being provided by subtracting the first voltage level from the second voltage level, the A/D converter comprising:
    amplifying means (1) for amplifying an input signal;
    a first capacitor (C1) for storing a voltage level, the voltage level being generated at an output of the amplifying means from the first voltage level;
    a second capacitor (C2) for storing a voltage level, the voltage level being generated at the output of the amplifying means from the second voltage level;
    a comparator (2, 3) coupled to the output of the amplifying means;
    a D/A converter (5) controlled by a comparison result of the comparator;
    switching means for switching connection of the first and second capacitors to between an input of the amplifying means (1) and the D/A conversion section (5); and
    a control section for controlling turning-on and turning-off of the switching means, the switching means changing the connection of the first and second capacitors to between the input of the amplifying means (1) and the D/A converter (5) to produce a difference between a voltage of the first capacitor and a voltage of the second capacitor at the output of the amplifying means and to perform cyclic A/D conversion of the difference using the first and second capacitors.

2. The A/D converter according to claim 1, further comprising:
    a third capacitor (C3) coupled between an input terminal of the A/D converter and an input of the amplifying means;
    a fourth capacitor (C5) coupled between an output of the amplifying means (1) and the input, a capacitance ratio of the third capacitor and fourth capacitor (C5) defining a gain of the amplifying means; and
    another switching means for controlling connection of the third and fourth capacitors (C3, C5) and the amplifying means (1).

3. The A/D converter according to claim 2, wherein the amplifying means (1) is a MOS amplifier circuit, and in the MOS amplifier circuit, a polarity of an output signal is inverted with respect to a polarity of an input signal,
wherein in amplification in the MOS amplifier circuit to perform noise cancellation,
    the third capacitor (C3) is coupled between the input terminal of the A/D converter and an input terminal of the MOS amplifier circuit,
    the fourth capacitor (C5) is coupled between the input terminal of the MOS amplifier circuit and an output terminal of the MOS amplifier circuit, and
    one end of the first capacitor (C1) and one end of the second capacitor (C2) are coupled by turns to the output terminal of the MOS amplifier circuit so as to store the first voltage level and the second voltage level, respectively, then the one ends of the first capacitor and second capacitor are coupled together to provide a series circuit of the first and second capacitors, and one end of the series circuit is coupled to the input terminal of the MOS amplifier circuit and the other end of the series connection is connected to ground, and wherein
    in cyclic A/D conversion of a noise-canceled signal in the MOS amplifier circuit,
    the third capacitor (C3) is coupled to the input terminal and output terminal of the MOS amplifier circuit,
    the cyclic A/D conversion comprises first and second phases,
    the cyclic A/D conversion is performed by repeating the first phase and the second phase, one terminal of the first capacitor (C1) is coupled to the output terminal of the MOS amplifier circuit in the first phase, while the terminal of the first capacitor (C1) is switched to the D/A conversion section, the D/A conversion section provides a reference voltage for D/A conversion in the second phase, and other terminal of the first capacitor (C1) is connected to the earth potential in the first phase, while the other terminal of the first capacitor (C1) is switched to the input terminal of the MOS amplifier circuit in the second phase.

4. The A/D converter according to claim 2, wherein the amplifying means (1) is a MOS amplifier circuit with differential input and differential output, wherein in amplification in the MOS amplifier circuit to perform noise cancellation, the third capacitor (C3) is coupled between the input terminal of the A/D converter and a negative input terminal of the MOS amplifier circuit, the fourth capacitor (C5) is coupled between the negative input terminal of the MOS amplifier circuit and a positive output terminal of the MOS amplifier circuit, and the positive input terminal and negative output terminal of the MOS amplifier circuit are short-circuited and connected to a DC potential, and the first capacitor (C1) and the second capacitor (C2) are coupled by turns to the positive output terminal of the MOS amplifier circuit so as to store the first voltage level and second voltage level, respectively, and then, one ends of the first capacitor (C1) and the second capacitor (C2) are coupled to the negative input terminal and positive input terminal of the MOS amplifier circuit, respectively, while the other ends of the first capacitor (C1) and second capacitor (C2) are coupled to each other, and wherein in cyclic A/D conversion of a noise-canceled signal in the MOS amplifier circuit, the third capacitor (C3) is coupled to the negative input terminal and the positive output terminal of the MOS amplifier circuit, the fifth capacitor (C4) is coupled to the negative input terminal and the positive output terminal of the MOS amplifier circuit, the cyclic A/D conversion comprises a first phase and a second phase, and the cyclic A/D conversion is performed by repeating the first and second phases, one terminal of the first capacitor (C1) and one terminal of the second capacitor (C2) are coupled to the positive output terminal and negative output terminal of the MOS amplifier circuit in the first phase, respectively, while the one terminal of the first capacitor (C1) and the one terminal of the second capacitor (C2) are switched to a D/A conversion section, and the D/A conversion section provides a reference voltage for D/A conversion in the second phase, and other terminal of the first capacitor (C1) and other terminal of the second capacitor (C2) are switched to ground in the first phase, while the other terminal of the first capacitor (C1) and the other terminal of the second capacitor (C2) are switched to the negative input terminal and the positive input terminal of the MOS amplifier circuit in the second phase, respectively.

5. The A/D converter according to claim 3, wherein, in the cyclic A/D conversion by use of the fourth capacitor (C5), the fourth capacitor (C5) is coupled to between the input terminal and the output terminal of the MOS amplifier circuit, thereby reducing a number of switching elements.

6. The A/D converter according to claim 1, further comprising:

a first input terminal for receiving one of first and second signal sequences and a second input terminal for receiving the other of the first and second signal sequences;

a third capacitor (C3) coupled between the first input terminal and a first input of the amplifying means (1);

a fourth capacitor (C5) coupled between the first input of the amplifying means (1) and a first output of the amplifying means (1), a capacitance ratio of the fourth capacitor (C5) and the third capacitor defining a gain of the amplifying means;

a fifth capacitor (C4) coupled between the second input terminal and a second input of the amplifying means (1);

a sixth capacitor (C6) coupled between the second input of the amplifying means (1) and a second output of the amplifying means (1), a capacitance ratio of the third capacitor and the sixth capacitor (C6) defining a gain of the amplifying means; and two capacitors (C1B, C2B) for storing the first voltage level and the second voltage level, respectively, the amplifying means (1) comprising a differential amplifier with two input terminals and two output terminals, and comprising first and second modes, the first and second modes being switchable, in the first mode, the differential amplifier operating as an amplifier circuit with differential input and differential output to perform cyclic A/D conversion, and in the second mode, a common source of the differential amplifier being connected to a constant potential such that the differential amplifier operates as two single-ended amplifiers to perform noise cancellation.

7. The A/D converter according to claim 6, wherein the first and second signal sequences are provided from first and second column lines, respectively, the first and second column lines are coupled to first and second pixel rows of an image sensor pixel array, respectively, and the image sensor pixel array includes a plurality of pixels arranged in rows and columns.

8. The A/D converter according to claim 4, wherein, in the cyclic A/D conversion by use of the fourth capacitor (C5), the fourth capacitor (C5) is coupled to between the input terminal and the output terminal of the MOS amplifier circuit, thereby reducing a number of switching elements.

9. An A/D converter with a function of noise cancellation of a signal including first and second voltage levels alternately arranged, the first voltage level containing a noise component, the second voltage level containing a significant signal component and a noise component, the significant signal component being superimposed on the noise component, the function of noise cancellation being provided by subtracting the first voltage level from the second voltage level, the A/D converter comprising:

a first stage amplifying means (6) for amplifying an input signal;

a first capacitor (C1) for storing a voltage level, the voltage level being generated from the first voltage level at an output of the first stage amplifying means;

a second capacitor (C2) for storing a voltage level, the voltage level being generated from the second voltage level at the output of the first stage amplifying means;

a second stage amplifying means (1) for amplifying a difference between a voltage of the first capacitor and a voltage of the second capacitor;

a comparator (2, 3) coupled to an output of the second stage amplifying means;
a D/A conversion section (5) controlled by a comparison result of the comparator;
a switching means for switching connection of the first and second capacitors; and a control section for controlling turning-on and turning-off of the switching means, the switching means changing the connection of the first and second capacitors to perform noise cancellation and cyclic A/D conversion of the difference using the first and second capacitors.

* * * * *